(12) United States Patent
Feezell et al.

(10) Patent No.: US 7,480,322 B2
(45) Date of Patent: Jan. 20, 2009

(54) ELECTRICALLY-PUMPED (GA,IN,AL)N VERTICAL-CAVITY SURFACE-EMITTING LASER

(75) Inventors: Daniel F. Feezell, Santa Barbara, CA (US); Daniel A. Cohen, Santa Barbara, CA (US); Robert M. Farrell, Goleta, CA (US); Masahiro Ishida, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/803,472

(22) Filed: May 15, 2007

(65) Prior Publication Data

US 2007/0280320 A1 Dec. 6, 2007

Related U.S. Application Data

(60) Provisional application No. 60/800,391, filed on May 15, 2006.

(51) Int. Cl.
*H01S 5/00* (2006.01)
*H01S 3/08* (2006.01)

(52) U.S. Cl. .................. 372/50.124; 372/103
(58) Field of Classification Search ............. 372/43.01, 372/50.124, 50.1, 103
See application file for complete search history.

(56) References Cited

U.S. PATENT DOCUMENTS

2001/0042866 A1 11/2001 Coman et al.
2006/0194359 A1 8/2006 Weisbuch et al.
2007/0125995 A1 6/2007 Weisbuch et al.

OTHER PUBLICATIONS

S. Park et al., "Room-temperature GaN vertical-cavity surface-emitting laser operation in an extended cavity scheme," Applied Physics Letters, Sep. 15, 2003, pp. 2121-2123, vol. 83, No. 11.

T. Tawara et al., "Low-threshold lasing of InGaN vertical-cavity surface-emitting lasers with dielectric distributed Bragg reflectors," Applied Physics Letters, Aug. 4, 2003, pp. 830-832, vol. 83, No. 5.

Y. Song et al., A quasicontinuous wave, optically pumped violet vertical cavity surface emitting laser, Applied Physics Letters, Mar. 27, 2000, pp. 1662-1664, vol. 76, No. 13.

T. Margalith et al., "Nitride-based lasers: advances in cavity design," Presented at SPIE Photonics West, San Jose, CA, No. 3944-01, Jan. 22-28, 2000, pp. 10-21.

(Continued)

*Primary Examiner*—Armando Rodriguez
(74) *Attorney, Agent, or Firm*—Gates & Cooper LLP (57) ABSTRACT

A vertical-cavity surface-emitting laser (VCSEL) comprising a low-loss thin metal contact and current spreading layer within the optical cavity that provides for improved ohmic contact and lateral current distribution, a substrate including a plano-concave optical cavity, a (Ga,In,Al)N multiple quantum well (MQW) active region contained within the optical cavity that generates light when injected by an electrical current, and an integrated micromirror fabricated onto the substrate that provides for optical mode control of the light generated by the active region. A relatively simple process is used to fabricate the VCSEL.

20 Claims, 4 Drawing Sheets

OTHER PUBLICATIONS

M. Diagne et al., "Vertical cavity violet light emitting diode incorporating an aluminum gallium nitride distributed Bragg mirror and a tunnel junction," Applied Physics Letters, Nov. 26, 2001, pp. 3720-3722, vol. 79, No. 22.

T. Margalith et al., "Indium tin oxide contacts to gallium nitride optoelectronic devices," Applied Physics Letters, Jun. 28, 1999, pp. 3930-3932, vol. 74, No. 26.

Y. Lin et al., "InGaN/GaN light emitting diodes with Ni/Au, Ni/ITO and ITO p-type contacts," Solid-State Electronics, 2003, pp. 849-853, vol. 47.

C. Hsu et al., "Thermal Annealing Effect of Indium Tin Oxide Contact to GaN Light-Emitting Diodes," Japanese Journal of Applied Physics, 2005, pp. 7424-7426, vol. 44, No. 10.

R. Horng et al., "Low-resistance and high-transparency Ni/indium tin oxide ohmic contacts to p-type GaN," Applied Physics Letters, Oct. 29, 2001, pp. 2925-2927, vol. 79, No. 18.

S. Kim et al., "Effect of an indium-tin-oxide overlayer on transparent Ni/Au ohmic contact on p-type GaN," Applied Physics Letters, Jan. 6, 2003, pp. 61-63, vol. 82, No. 1.

S. Pan et al., "Enhanced Output Power of InGaN-GaN Light-Emitting Diodes With High-Transparency Nickle-Oxide-Indium-Tin-Oxide Ohmic Contacts," IEEE Photonics Technology Letters, May 2003, pp. 646-648, vol. 15, No. 5.

J. Song et al. "Improvement of the Luminous Intensity of Light-Emitting Diodes by Using Highly Transparent Ag-Indium Tin Oxide p-Type Ohmic Contacts," IEEE Photonics Technology Letters, Feb. 2005, pp. 291-293, vol. 17, No. 2.

S. Nakamura et al., "InGaN/Gan/AlGaN-based laser diodes with modulation-doped strained-layer superlattices grown on an epitaxially laterally grown GaN substrate," Applied Physics Letters, Jan. 12, 1998, pp. 211-213, vol. 72, No. 12.

D. F. Feezell et al., "Thin metal intracavity contact and lateral current-distribution scheme for GaN-based vertical cavity lasers," Applied Physics Letters, (2007) vol. 90, 181128-1-181128-3.

ELECTRICALLY-PUMPED (GA,IN,AL)N VERTICAL-CAVITY SURFACE-EMITTING LASER

CROSS-REFERENCE TO RELATED APPLICATIONS

This application claims the benefit under 35 U.S.C. §119 (e) of the following commonly-assigned U.S. patent application:

U.S. Provisional Patent Application Ser. No. 60/800,391, filed on May 15, 2006, by Daniel F. Feezell, Daniel A. Cohen, Robert M. Farrell, Masahiro Ishida and Shuji Nakamura, entitled "ELECTRICALLY PUMPED (Ga,In,Al)N VERTICAL-CAVITY SURFACE-EMITTING LASER,"

which application is incorporated by reference herein.

This application is related to the following and commonly-assigned applications:

U.S. Utility application Ser. No. 11/067,957, filed Feb. 28, 2005, by Claude C. A. Weisbuch, Aurelien David, James S. Speck and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE," and U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH," which applications claims the benefit under 35 U.S.C. §119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,"

all of which applications are incorporated by reference herein.

BACKGROUND OF THE INVENTION

1. Field of the Invention

This invention is related to a method for improved electrical contact quality and current distribution in an electrically-pumped (Al,In,Ga)N Vertical-Cavity Surface-Emitting Laser (VCSEL), and a structural design for an electrically-pumped (Al,In,Ga)N VCSEL utilizing these improvements.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

There is a need for optical sources for various commercial, industrial, or scientific applications. Due to several inherent advantages of VCSEL devices, such as their ability to form densely packed arrays, on-wafer testing, and low power consumption, these devices may offer a lower cost alternative to traditional edge-emitting lasers and improved performance over Light Emitting Diodes (LEDs).

VCSELs may find utility in applications such as full-color displays, where the VCSEL's small spot size and higher power will yield higher brightness and higher resolution images and lighting displays (compared to those using LEDs). These structures are ideal for solid-state lighting and may offer much higher wall-plug efficiencies than can be achieved with LEDs. Another application, which results from the shorter wavelength and smaller spot size provided by (Ga,In,Al)N VCSELs, is high resolution printing and high throughput printing. Additionally, large arrays could increase printer throughput. (Ga,In,Al)N VCSELs could also provide a simple and low-cost optical head for next generation optical data storage.

At this time, (Ga,In,Al)N VCSELs only exist as optically pumped structures [1-3]. These structures require the implementation of large and costly pumping lasers, which limits their practical and commercial utility. Electrically pumped structures have been proposed and preliminary results have been reported [4,5]. However, they have not been successful and have required either difficult fabrication techniques or difficult epitaxial growths. In addition, they lack the benefits of an integrated micromirror or intra-cavity metal contact and current distribution layer.

There is a need, then, for improved methods of generating electrically-pumped VCSELs. The present invention satisfies that need.

SUMMARY OF THE INVENTION

To overcome the limitations in the prior art described above, and to overcome other limitations that will become apparent upon reading and understanding the present specification, the present invention discloses a VCSEL comprising: a thin metal layer placed at an optical standing wave null within the cavity that provides for improved ohmic contact and lateral current distribution, a substrate including a plano-concave optical cavity, a (Ga,In,Al)N multiple quantum well (MQW) active region contained within the optical cavity that generates light when injected by an electrical current, and an integrated micromirror fabricated onto the substrate that provides for optical mode control of the light generated by the active region. A relatively simple process is used to fabricate the VCSEL.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention discloses a novel approach for producing monolithic green, blue, violet, or ultraviolet (UV) emitting VCSELs. The electrically-pumped device incorporates a substrate within an optical cavity and a plano-concave structure that is comprised of an epitaxially grown (Ga,In,Al)N base-structure with quantum wells, an integrated micromirror for control of the optical mode, and a thin metal intra-cavity contact and current aperture for improved ohmic contact and/or current distribution. The above elements are contained between two distributed Bragg reflector (DBR) mirrors.

The primary novel aspect of this structure is the inclusion of a low-loss thin metal intra-cavity contacting scheme which will provide an excellent non-rectifying, low-resistance contact and significantly enhance lateral current distribution, a requirement for efficient operation of VCSELs. The thin metal layer is placed at an optical standing wave null in order to minimize optical absorption loss.

Another novel aspect of the invention is the means to separately control the optical mode and the current distribution within a (Ga,In,Al)N VCSEL. An integrated micromirror functions in tandem with the novel current distribution scheme to enable optimized modal overlap. The micromirror is fabricated onto the backside of the substrate and allows for a large stable single optical mode diameter which, when combined with a uniform current density profile, enables higher power devices (e.g., 30 micron diameter, 100 mW output power).

Yet another novel aspect of the invention is the relatively simple fabrication technology compared to other proposed approaches for (Ga,In,Al)N VCSELs. Whereas previous proposals have relied on electrically conductive epitaxial DBRs, which have never been fabricated with adequate reflectivity, or difficult fabrication schemes to incorporate dielectric DBRs into planar cavities, the present invention utilizes straightforward fabrication techniques to incorporate intra-cavity electrical contacts with dielectric DBRs in a plano-concave cavity. The final device is achievable without significantly difficult epitaxial growth, substrate removal, or wafer bonding.

It is believed that a monolithic electrically-pumped (Ga,In,Al)N VCSEL structure such as this, with a low-loss thin metal intra-cavity contact and current distribution layer, has never been proposed. It is also believed that a monolithic electrically-pumped (Ga,In,Al)N VCSEL structure such as this, with the optical mode and current profile separately controllable by the aforementioned means, has never been proposed. Such a laser would have application in high brightness and high resolution lighting displays, high resolution or high throughput printers, next generation DVD players, and efficient solid-state lighting.

Technical Description

This invention is an electrically-pumped VCSEL comprised of semiconductor material alloys such as, but not limited to, (Ga,In,Al)N. The device is fabricated using well-established semiconductor device processing techniques.

Figure 1:
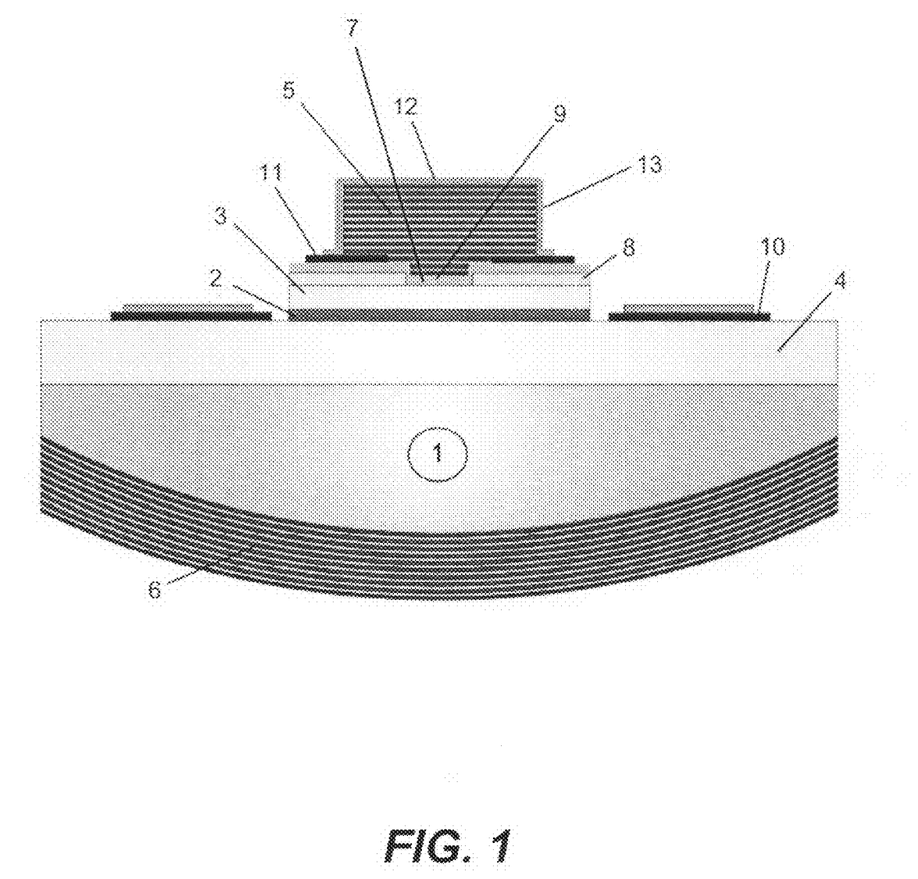
FIG. 1 shows a detailed schematic of a device according to the preferred embodiment of the present invention.

FIG. 1 shows a detailed schematic of an embodiment of the device and will be used to describe the preferred embodiment of the device. Alternative embodiments will be suggested in a subsequent section.

In the preferred embodiment, the structure is comprised of a plano-concave or plano-plano cavity formed on a substrate (1), which utilizes an integrated micromirror fabricated onto the substrate (1) for controlling an optical mode of the VCSEL. The integrated micromirror may be fabricated onto the substrate (1) via standard dry etching techniques. In the preferred embodiment, this substrate is comprised of sapphire ($Al_2O_3$). The radius of curvature of the micromirror and the thickness of the substrate determine the optical beam diameter throughout the cavity, and the radius of curvature of the micromirror is chosen to provide a stable cavity condition. The integration of a micromirror allows for a large single optical mode diameter, on the order of approximately ten microns, and provides the potential for high-power single-lateral-mode operation. Thus, controlling the optical mode diameter and cavity stability of the VCSEL comprises selecting the radius of curvature of the micromirror.

The cavity may include a (Ga,In,Al)N multiple quantum well active region (2) that is placed at a peak of the cavity's optical standing wave. This allows for increased single-pass gain by maximizing the interaction between the electrically injected carriers and the optical field.

This active region (2) may be clad by various layers which may comprise (Ga,In,Al)N that are intended for current injection and/or confinement. Reference numbers (3) and (4) represent these (Ga,In,Al)N cladding layers, with one layer being comprised of p-type material and/or unintentionally doped (UID) material and one layer being comprised of n-type material and/or UID material. These cladding layers (3) and (4) function as the p and n sides of the junction diode containing the active region (2).

The optical cavity is defined by two DBR mirrors as represented by reference numbers (5) and (6). These mirrors (5) and (6) may be comprised of alternating index dielectric layers or epitaxial layers. In the preferred embodiment, the mirror stacks (5) and (6), are dielectric and are comprised of alternating layers of low and high refractive index material. The top mirror or reflector (5) is a flat reflector, while the bottom mirror or reflector (6) is a curved reflector that conforms to the curvature of the micromirror.

An intra-cavity current aperture (7) has dimensions that are defined by lithographic patterning of a dielectric material (8), which, in the preferred embodiment, is either silicon dioxide ($SiO_2$) or silicon nitride ($SiN_x$).

This aperture (7) serves to confine the current to the center of the device where the optical mode is strongest. In a typical VCSEL, it is desirable to achieve a uniform current density profile within the aperture region to obtain high modal gains. Traditionally, however, apertured intra-cavity contacted VCSELs have suffered from increased current crowding around the periphery of the aperture. This limitation has been overcome in other materials systems by utilizing highly doped current distribution layers or tunnel junctions.

Unfortunately, the (Ga,In,Al)N materials system does not yet provide an efficient current distribution layer or reliable tunnel junction. In order to circumvent this limitation, the present invention has developed a novel intra-cavity thin metal layer to achieve ohmic contacts and efficient current spreading simultaneously.

Reference number (9) in FIG. 1 represents a contact and/or current distribution layer or layers. In the preferred embodiment, reference number (9) is a low-loss thin metal layer or combination of layers, such as nickel/gold or palladium/gold. This low-loss thin metal layer (9) is placed at a null of the cavity standing wave to minimize optical absorption loss.

Also, the p-(Ga,In,Al)N cladding may also include a phase matching layer, to account for any phase change introduced by the thin metal layer (9) to the optical standing wave.

Additionally, although not required, a transparent conductive oxide layer, such as ITO, may be implemented between the metal contact/spreading layer (9) and the DBR layers (5) to enhance current spreading capabilities and/or the chemical or mechanical stability of the metal contact. This potential layer is not shown in the preferred embodiment of the device in FIG. 1.

Previous electrically injected VCSEL designs [5,6] have utilized a solitary conductive oxide (e.g. ITO) layer in direct contact with p-type GaN. However, such contacts have been shown to be highly rectifying and of poor reliability [7,8]. In contrast, reliable, non-rectifying, and low-resistance (approximately $10^{-4}$ $\Omega$-cm$^2$) contacts to p-GaN can be achieved by inserting a thin metal layer between the ITO layer and the p-type GaN [9-12]. In addition, adding a thin metal layer can also provide enhanced current distribution within the aperture (7) region.

Reference numbers (10) and (11) represent electrical contacts, wherein reference number (10) represents a contact to n-type material (e.g. Ti/Al/Ni/Au), and reference number (11) is an additional metal contact to the thin metal current spreading layer (9) and is optionally present for simplified fabrication.

Reference number (12) depicts robust pad metal on the n and p contacts for the purpose of connection to external circuitry.

Reference number (13) is the VCSEL pillar formed by etching, which comprises the active layer (2), the cladding layers (3), the aperture (7) in the dielectric material (8), and the low-loss thin metal layers (9).

Thus, FIG. 1 illustrates an electrically injected VCSEL comprising a substrate (1), an optical cavity formed on the substrate and bounded by a top reflector (5) and a bottom reflector (6), an active region (2) contained within the optical cavity that generates light when injected with an electrical current, one or more cladding layers (3) and (4) that clad the active region (2) and provide for control of current injection or optical confinement, or current injection and optical confinement, and one or more metal layers (9) placed within the optical cavity near a null of an optical standing wave to minimize optical loss, wherein the metal layers (9) simultaneously provide lower resistance, non-rectifying electrical contact, and enhanced lateral current spreading to the VCSEL compared to a VCSEL without the metal layers (9). The metal layers (9) may have a thickness which is less than 10% of the optical standing wave's wavelength in the optical cavity and the metal layers (9) may be made of a material which minimizes optical absorption for the optical standing wave's wavelength. For example, the metal layers (9) may comprise a combination of Palladium and Gold (Pd/Au) or Nickel and Gold (Ni/Au). FIG. 1 also shows how the metal layers (9) may be adjacent (3) to the cladding layers.

The VCSEL may further comprise at least one conductive oxide layer in between the metal layers (9) and the top reflector (5) for achieving the non-rectifying, lower-resistance, ohmic contact and enhanced current spreading to the VCSEL in combination with the metal layers (9).

The active region (2) and or cladding layers (3), (4) may be comprised of III-nitride material, for example, (Ga,In,Al)N material.

The optical cavity may be plano-concave or plano-plano. For example, the top reflector (5) may be a flat DBR or metallic mirror and the bottom reflector (6) may be a flat DBR or metallic mirror. FIG. 1 also shows how the VCSEL may include an integrated micromirror fabricated onto the substrate (1) for controlling an optical mode diameter and cavity stability of the VCSEL. The top reflector (5) may be a flat distributed Bragg reflector (DBR) or metallic mirror, and the bottom reflector (6) may be a curved DBR or metallic mirror that conforms to a curvature of an integrated micromirror.

The combination of the metal layers (9) and the integrated curved micromirror enables a larger diameter single optical mode VCSEL having a higher output power as compared to a VCSEL without the combination. Lower resistance, non-rectifying ohmic electrical contact and enhanced lateral current spreading to the VCSEL may achieved using a combination of the cladding layers (3), (4), the metal layers (9) and at least one conductive oxide layers placed in between the metal layers (9) and the top reflector (5).

FIG. 1 also shows how the VCSEL may include an aperture (7) for the metal layers (9) for selectively confining current to the center of the VCSEL, where an optical mode is strongest. A dielectric material (8) may be deposited on the cladding layers (3), in order to define an aperture (7), by patterning for example, wherein the metal layers (9) are deposited on and around the dielectric material (8), and inside the aperture (7).

In addition, the present embodiment enables a method for optimizing a VCSEL's optical gain and output power, comprising independently controlling an optical mode and current distribution in the VCSEL by using a mirror fabricated on the VCSEL's substrate (1) to increase the diameter and stability of the optical mode, and using one or more metal layers (9) in the VCSEL to simultaneously enhance current spreading, reduce contact resistance and provide ohmic contact to the VCSEL. The metal layers (9) may electrically couple an electrical contact (11) to a doped cladding layer (3), and may be deposited on a patterned dielectric layer (8) such that a current aperture (7) in the patterned dielectric layer (8) contains the metal layers (9).

Figure 2:
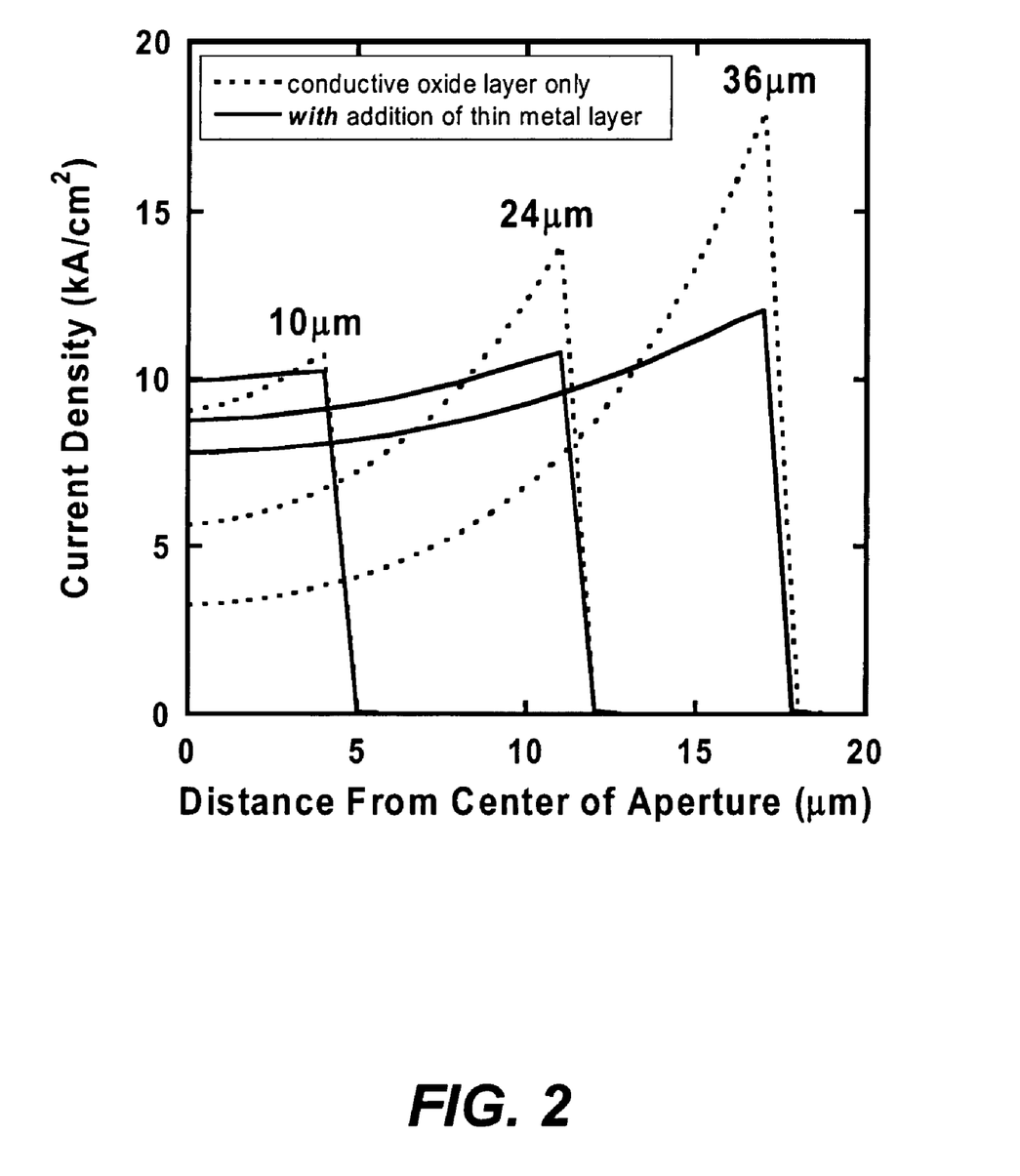
FIG. 2 is a graph that illustrates an example of improved current density uniformity through the implementation of a thin metal layer.

FIG. 2 is a graph that illustrates a simulation of an embodiment where the enhanced current distribution is provided by the addition of a thin metal layer. Although similar contacts have been described elsewhere for applications to (Ga,In,Al)N LEDs [9-12], the intra-cavity contacting and current distribution scheme described above is a novel invention within the context of a VCSEL structure.

Figure 3:
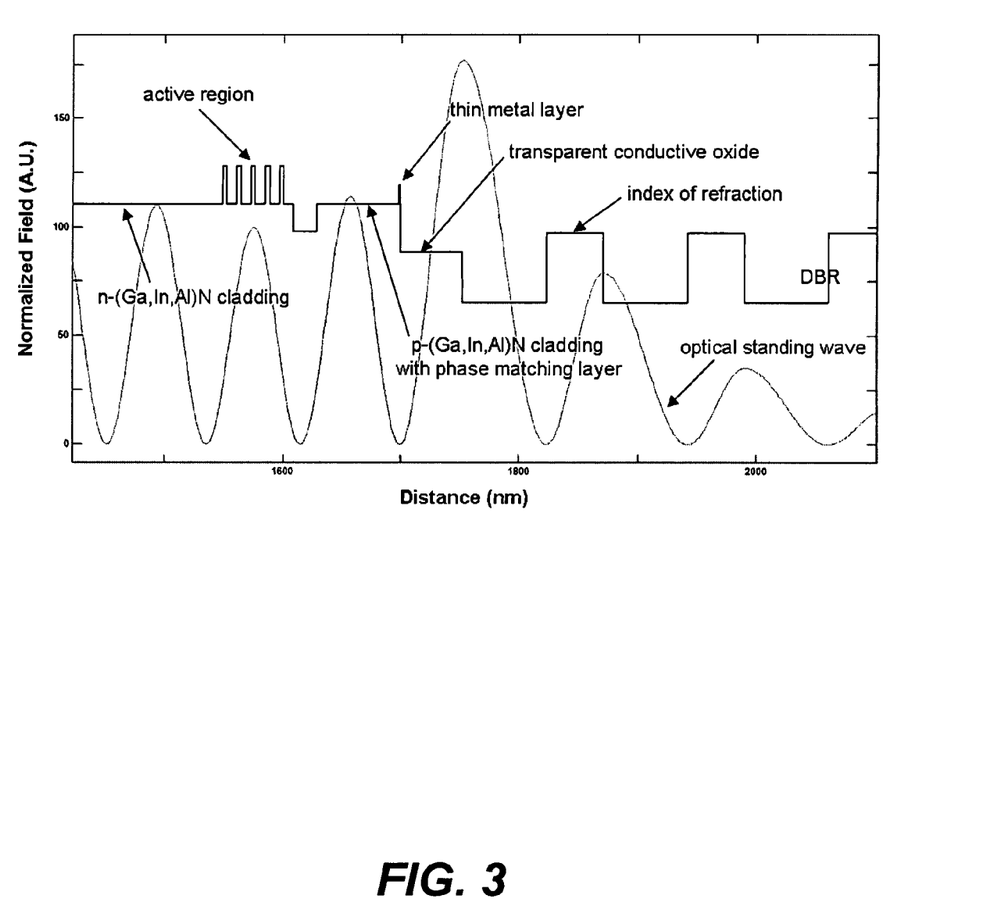
FIG. 3 is a graph that shows a segment of the optical standing wave pattern in a VCSEL cavity.

FIG. 3 shows a segment of the index of refraction and the electric field standing wave pattern vs. position inside the VCSEL optical cavity for a typical embodiment of the invention. FIG. 3 is intended to illustrate the location of the active region and metal layers relative to the standing wave The active region is shown positioned at a standing wave peak, while the thin metal contact/current distribution layer is positioned at a standing wave null. It is imperative that the metal layer is thin relative to a half-wavelength of the standing wave and placed at the standing wave null to minimize optical absorption. This is a key element of this invention. This thin metal layer has a thickness of much less than half the wavelength of the light emitted by the VCSEL, taking into account the refractive index of the materials comprising the VCSEL. For a (Ga,In,Al)N laser emitting a wavelength of ~500 nm, this thickness would preferably be less than 10 nm. A low-loss metal layer refers to a metal layer comprised of a material that minimizes optical absorption for the wavelength of light being emitted by the VCSEL.

Process Steps

Figure 4:
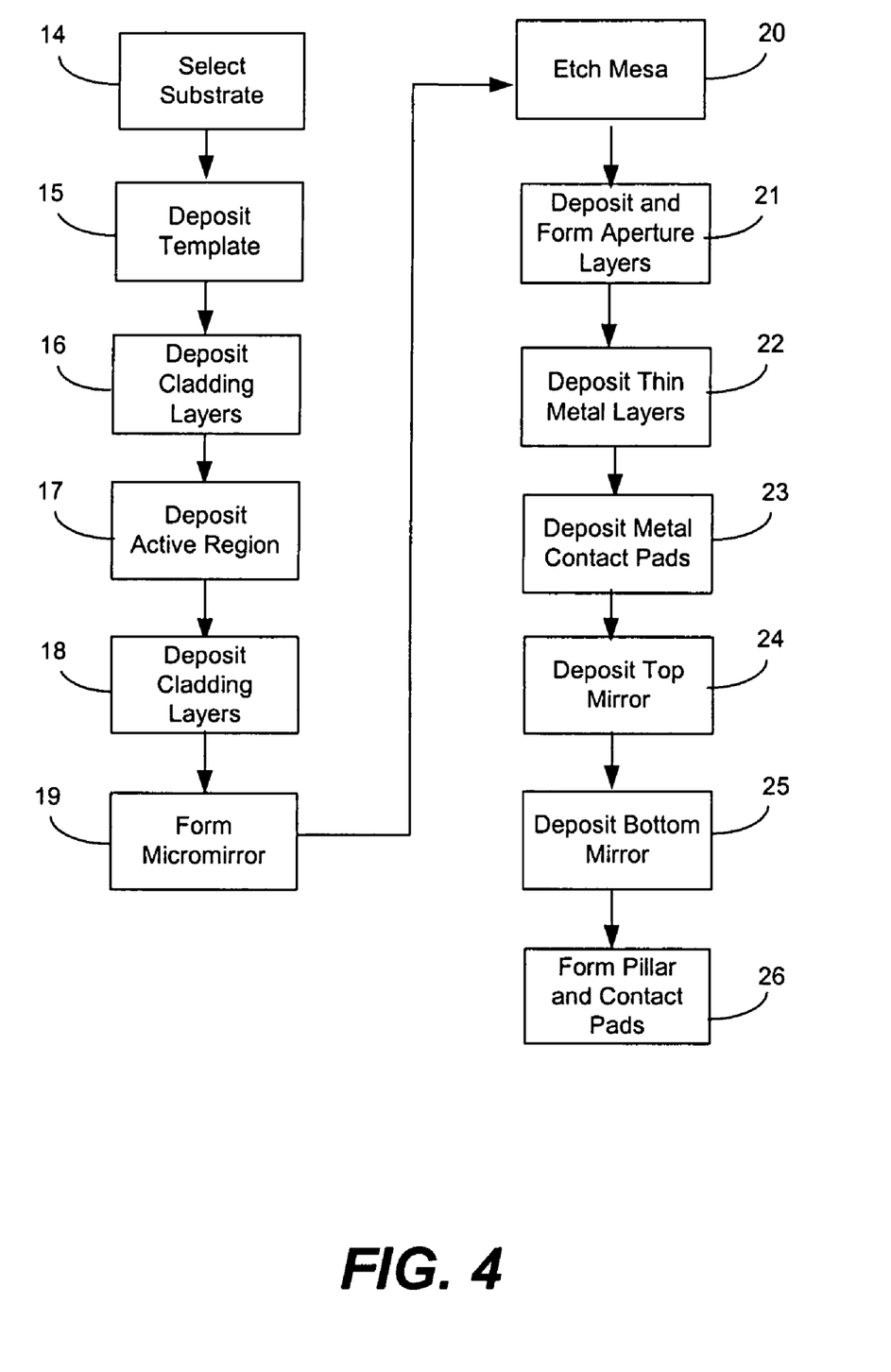
FIG. 4 is a flow chart illustrating the method steps for fabricating the VCSEL according to the preferred embodiment.

FIG. 4 is a flowchart that illustrates the process steps for fabricating a VCSEL according to the preferred embodiment of the present invention.

Block 14 represents the step of selecting a substrate. This step may comprise selecting a thickness for the substrate, a material composition for the substrate, or an orientation for the substrate.

Block 15 represents the step of depositing a template layer on the substrate. This template layer may be deposited using a Lateral Epitaxial Overgrowth (LEO) technique.

Block 16 represents the step of depositing one or more first cladding layers on top of the substrate or template layer.

Block 17 represents the step of depositing an active region on top of the first cladding layers. The active region layers may be positioned at a maximum intensity of the optical standing wave pattern of the VCSEL.

Block 18 represents the step of depositing one or more second cladding layers on top of the active region. The second cladding layers may include a phase matching layer to account for potential phase introduced by the low-loss thin metal layers.

Block 19 represents the step of selecting a micromirror radius of curvature, prior to forming the micromirror, to achieve a desired optical mode pattern inside the optical cavity of the VCSEL. In one embodiment, the micromirror is formed by etching into the substrate with a pattern transfer technique, although other fabrication techniques may be used.

Block 20 represents the step of etching a mesa in the first cladding layers, active region and second cladding layers, in order to define a volume that comprises a VCSEL pillar and at least one low-loss thin metal layer.

Block 21 represents the step of depositing an aperture layer on top of the second cladding layers. The aperture layer may be formed by depositing a dielectric layer and then patterning an aperture in the dielectric layer.

Block 22 represents the step of depositing one or more low-loss thin metal layers on top of the aperture layer. This step forms the important thin metal intra-cavity contact layer and current spreading layer. The cavity should be designed such that the low-loss thin metal layers are positioned at or near a standing wave null of the VCSEL optical cavity mode. Thus, Block 21 represents a method for enhancing current spreading and providing reliable low resistance ohmic contacts in the VCSEL, by incorporating the metal layer.

Block 23 represents the step of depositing metal contact pads, comprising an n-contact, for example, on top of the thin metal layers. These metal pads are for electrical contact to the VCSEL.

Block 24 represents the step of depositing a top mirror, such as a dielectric DBR, on top of the thin metal layer, to form the top reflector for the VCSEL cavity.

Block 25 represents the step of depositing an epitaxial or dielectric DBR on the surface of the micromirror, as created in Block 19, to form the bottom reflector for the VCSEL cavity.

Block 26 represents the step of forming a VCSEL pillar from the top DBR mirror and then depositing metal probing pads for electrical testing of the structure.

Those skilled in the art will recognize the exact sequence of steps may vary, and that steps may be introduced or omitted as required.

Possible Modifications and Variations

There are multiple applications for and variations on this invention.

Substrates other than c-plane sapphire could be used for the practice of this invention. The scope of this invention includes the growth and fabrication of III-nitride or (Ga,In,Al)N VCSELs on all possible crystallographic orientations of all possible substrates. These substrates include, but are not limited to, a-plane sapphire, m-plane sapphire, r-plane sapphire, silicon carbide, gallium nitride, zinc oxide, boron nitride, lithium aluminate, lithium niobate, aluminum nitride, lithium gallate, partially substituted spinels, and quaternary tetragonal oxides sharing the $\gamma$-LiAlO$_2$ structure. The substrate may also be thinned and/or polished in some instances. A plano-concave cavity may also be obtained by wafer bonding techniques. Alternatively, the substrate of the VCSEL may be removed.

Growth of (Ga,In,Al)N VCSELs on crystal growth orientations other than c-plane (Ga,In,Al)N could be used for the practice of this invention. The scope of this invention includes the growth and fabrication of (Ga,In,Al)N VCSELs on all possible crystallographic orientations of (Ga,In,Al)N. These crystallographic orientations include the nonpolar planes of the crystal. These include the $\{11\bar{2}0\}$ planes, known collectively as a-planes, and the $\{1\bar{1}00\}$ planes, known collectively as m-planes. These crystallographic orientations also include the semipolar planes of the crystal. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Therefore, layers comprising the optical cavity and active region (2), and the cladding layers (3), (4), as illustrated in FIG. 1, may be grown from materials having c-plane, non-polar or semi-polar orientation.

Variations in (Ga,In,Al)N quantum well and heterostructure design are possible without departing from the scope of the present invention. Moreover, the specific thickness and composition of the layers, the number of quantum wells grown, and the inclusion or omission of electron blocking layers are variables inherent to particular device designs and may be used in alternative embodiments of the present invention. For instance, the preferred embodiment of the invention utilizes InGaN-based quantum wells for light emission in the blue region of the spectrum. However, the scope of the invention also includes devices with AlGaN—, AlInN—, and AlInGaN-based quantum wells, which could be designed for light emission in other regions of the spectrum.

The cladding layers (3) and (4) of FIG. 1 may be n-type, p-type, UID, co-doped, or semi-insulating and may be comprised of any (Ga,In,Al)N alloy, as well as other materials with desirable properties. These layers (3) and (4) may or may not include various phase matching layers.

The DBR mirrors (5) and (6) of FIG. 1 may be comprised of dielectric materials or epitaxially grown materials. This could include, but is not limited to, one epitaxial mirror and one dielectric mirror. The DBR mirrors (5) and (6) may also contain various phase matching layers. Mirror diameter can range from 50 micron to 1 mm.

As noted above, reference number (7) of FIG. 1 defines the dimensions of the current aperture. The preferred embodiment uses either SiO$_2$ or SiN$_x$ as the dielectric material (8) to form the aperture (7). Other embodiments may use other dielectric materials (8). Additionally, the current aperture (7) may be defined by disordering or degradation of the underlying (Ga,In,Al)N layers via implantation or intermixing.

The thin metal layer (9) of FIG. 1 may be comprised of, but is not limited to, Ni, Pd, Ag, Au, Pt, Mo, Ti, Ta, etc. The layer (9) may also be comprised of a metal-oxide, such as NiO, AgO, ZnO, etc.

The transparent conductive oxide layer may be comprised of, but is not limited to, ITO, ZnO, GaO, etc. The transparent conductive oxide layer may also be completely absent from some embodiments of the device.

The (Ga,In,Al)N VCSELs described above can be grown directly on c-plane sapphire. However, the scope of this invention also covers (Ga,In,Al)N VCSELs grown on epitaxial laterally overgrown (ELO) templates of all possible crystallographic orientations on all possible substrates. For example, a template layer could be grown between the substrate (1) of FIG. 1 and the optical cavity, using an ELO (or lateral epitaxial overgrowth) technique. The ELO technique is a method of reducing the density of threading dislocations (TD) in subsequent epitaxial layers. Reducing the TD density leads to improvements in device performance. For (Ga,In,Al)N laser diodes, these improvements include increased output powers, increased internal quantum efficiencies, longer device lifetimes, and reduced threshold current densities [13]. These advantages will be pertinent to all VCSEL devices grown on Epitaxial Lateral Overgrowth (ELO) templates.

Advantages and Improvements Over Existing Practice

The realization of a blue, green, violet, or UV-emitting VCSEL would allow for multiple advances in commercial products and potentially lower their cost. High-brightness blue, green, violet, or UV light sources can be rapidly modulated and enable low cost, high efficiency and high reliability in video projection systems. Moreover, the wall plug efficiency of laser sources exceeds that of LEDs by several times, allowing for very energy-efficient lighting. These sources also offer a potentially low-cost optical head for the next generation optical data storage.

Historically, (Ga,In,Al)N-based VCSELs have suffered from the lack of low-loss optical guiding and efficient current distribution techniques, therefore reducing the available single-pass gain in the devices. Combined with further reduced gain levels due to heating effects, this has rendered an electrically pumped structure difficult to achieve. Furthermore, smooth, high-reflectivity DBRs have been difficult to achieve via epitaxial growth. Dielectric DBRs have shown promise, but their implementation typically requires removal of the substrate and polishing of the wafer.

This invention addresses several of those issues to yield a simple monolithic low-loss electrically-pumped structure. The simple monolithic nature of the device is the result of several features working in combination. First, the direct integration of a micromirror on the backside of the substrate avoids the necessity for substrate removal and provides low diffraction loss optical guiding. High-reflectivity dielectric DBRs can be directly deposited onto the smooth micromirror surface. Furthermore, an improved intra-cavity contact and current distribution scheme should lead to enhanced device performance. The addition of a thin metal layer/layers will result in low resistance ohmic contacts and enhanced current distribution across the aperture, thus reducing device heating, improving modal gain, and allowing for large-diameter high-power single-transverse-mode devices. The proposed intra-cavity contact and current distribution scheme is believed to be new within the context of VCSEL devices.

Finally, the elements stated above also work in tandem to provide separate control of the optical mode and current profile, thus allowing for optimized gain performance. Such a concept is believed to be new within the context of electrically-pumped (Ga,In,Al)N VCSEL devices.

REFERENCES

The following publications are incorporated by reference herein:

1. S. Park, J. Kim, H. Jeon, T. Sakong, S. Lee, S. Chae, Y. Park, C. Jeong, G. Yeom, and Y. Cho, "Room-temperature GaN vertical-cavity surface-emitting laser operation in an extended cavity scheme," Applied Physics Letters, Vol. 83, No. 11, Sep. 15, 2003.

2. T. Tawara, H. Gotoh, T. Akasaka, N. Kobayashi, and T. Saitoh, "Low-threshold lasing of InGaN vertical-cavity surface-emitting lasers with dielectric distributed Bragg reflectors," Applied Physics Letters, Vol. 83, No. 5, Aug. 4, 2003.

3. Y. Song, H. Zhou, M. Diagne, A. Nurmikko, R. Schneider Jr., C. Kou, M. Krames, R. Kern, C. Carter-Coman, and F. Kish, "A quasicontinuous wave, optically pumped violet vertical cavity surface emitting laser," Applied Physics Letters, Vol. 76, No. 13, Mar. 27, 2000.

4. T. Margalith, A. Abare, O. Buchinsky, D. Cohen, M. Hansen, A. Stonas, M. Mack, E. Hu, S. DenBaars, and L. Coldren, "Nitride-based lasers: advances in cavity design," Presented at SPIE Photonics West, San Jose, Calif., No. 3944-01, Jan. 22-28, 2000.

5. M. Diagne, Y. He, H. Zhou, E. Makarona, A. Nurmikko, J. Han, K. Waldrip, J. Figiel, T. Takeuchi, and M. Krames, "Vertical cavity violet light emitting diode incorporating an aluminum gallium nitride distributed Bragg mirror and a tunnel junction," Applied Physics Letters, Vol. 79, No. 22, Nov. 26, 2001.

6. T. Margalith, O. Buchinsky, D. Cohen, A. Abare, M. Hansen, S. DenBaars, and L. Coldren, "Indium tin oxide contacts to gallium nitride optoelectronic devices," Applied Physics Letters, Vol. 74, No. 26, pp. 3930-3932, Jun. 28, 1999.

7. Y. Lin, S. Chang, Y. Su, T. Tsai, C. Chang, S. Shei, C. Kuo, and S. Chen, "InGaN/GaN light emitting diodes with Ni/Au, Ni/ITO and ITO p-type contacts," Solid-state Electronics, Vol. 47, pp. 849-853, 2003.

8. C. Hsu, W. Lan, and Y. Wu, "Thermal Annealing Effect of Indium Tin Oxide Contact to GaN Light-Emitting Devices," Japanese Journal of Applied Physics, Vol. 44, No. 10, pp. 7424-7426, 2005.

9. R. Horng, D. Wuu, T. Lien, and W. Lan, "Low-resistance and high-transparency Ni/indium tin oxide ohmic contacts to p-type GaN," Applied Physics Letters, Vol. 79, No. 18, pp. 2925-2927, Oct. 29, 2001.

10. S. Kim, H. Jang, and J. Lee, "Effect of an indium-tin-oxide overlayer on transparent Ni/Au ohmic contact on p-type GaN," Applied Physics Letters, Vol. 82, No. 1, pp. 61-63, Jan. 6, 2003.

11. S. Pan, R. Tu, Y. Fan, R. Yeh, and J. Hsu, "Enhanced Output Power of InGaN—GaN Light-Emitting Diodes With High-Transparency Nickle-Oxide-Indium-Tin-Oxide Ohmic Contacts," IEEE Photonics Technology Letters, Vol. 15, No. 5, pp. 646-648, May 2003.

12. J. Song, D. Leem, J. Kwak, Y. Park, S. Chae, and T. Seong, "Improvement of the Luminous Intensity of Light-Emitting Diodes by Using Highly Transparent Ag-Indium Tin Oxide p-Type Ohmic Contacts," IEEE Photonics Technology Letters, Vol. 17, No. 2, pp. 291-293, February 2005.

13. S. Nakamura, M. Senoh, S. Nagahama, N. Iwasa, T. Yamada, T. Matsushita, H. Kiyoku, Y. Sugimoto, T. Kozaki, H. Umemoto, M. Sano, and K. Chocho, "InGaN/Gan/Al-GaN-based laser diodes with modulation-doped strained-layer superlattices grown on an epitaxially laterally grown GaN substrate," Applied Physics Letters, Vol. 72, No. 12, pp. 211-213, Jan. 12, 1998.

14. D. F. Feezell, R. M. Farrell, M. C. Schmidt, H. Yamada, M. Ishida, S. P. DenBaars, D. A. Cohen, and S. Nakamura, "Thin metal intracavity contact and lateral current-distribution scheme for GaN-based vertical-cavity lasers," Applied Physics Letters 90, 181128 (2007).

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An electrically injected vertical-cavity surface-emitting laser (VCSEL), comprising:
   (a) an optical cavity bounded by a top reflector and a bottom reflector;
   (b) an active region contained within the optical cavity that generates light when injected with an electrical current;
   (c) one or more cladding layers that clad the active region and provide for control of current injection; and
   (d) one or more low-loss thin metal layers placed within the optical cavity near a null of an optical standing wave to minimize optical loss and adjacent to the cladding layers;
   (e) wherein the low-loss thin metal layers simultaneously provide lower resistance, non-rectifying electrical contact, and enhanced lateral current spreading to the VCSEL as compared to a VCSEL without the metal layers.

2. The VCSEL of claim 1, wherein the low-loss thin metal layers comprise a combination of Palladium and Gold (Pd/Au) or Nickel and Gold (Ni/Au).

3. The VCSEL of claim 1, further comprising at least one conductive oxide layer in between the low-loss thin metal layers and the top reflector for achieving the non-rectifying, low-resistance, ohmic contact and enhanced current spreading to the VCSEL in combination with the low-loss thin metal layers.

4. The VCSEL of claim 1, wherein the active region is comprised of a (Ga,In,Al)N material.

5. The VCSEL of claim 1, wherein the cladding layers are comprised of a (Ga,In,Al)N material.

6. The VCSEL of claim 1, wherein the optical cavity is plano-concave or plano-plano.

7. The VCSEL of claim 1, further comprising a substrate, wherein the optical cavity is formed on the substrate.

8. The VCSEL of claim 7, further comprising an integrated micromirror fabricated onto the substrate for controlling an optical mode diameter and cavity stability of the VCSEL.

9. The VCSEL of claim 8, wherein a combination of the low-loss thin metal layers and the integrated curved micromirror enables a large diameter single optical mode VCSEL having high output power as compared to a VCSEL without the combination.

10. The VCSEL of claim 1, wherein the top reflector is a flat distributed Bragg reflector (DBR) or metallic mirror, and the bottom reflector is a curved DBR or metallic mirror that conforms to a curvature of an integrated micromirror.

11. The VCSEL of claim 1, further comprising an aperture for the low-loss thin metal layers for selectively confining current to the center of the VCSEL where an optical mode is strongest.

12. The VCSEL of claim 1, wherein the low resistance, non-rectifying ohmic electrical contact and enhanced lateral current spreading to the VCSEL is achieved using a combination of the cladding layers, the low-loss thin metal layers and at least one conductive oxide layers placed in between the low-loss thin metal layers and the top reflector.

13. The VCSEL of claim 1, wherein the top reflector is a flat dielectric distributed Bragg reflector (DBR), metallic mirror, or combined metallic/dielectric DBR mirror, and the bottom reflector is a flat dielectric DBR, metallic mirror, or combined metallic/dielectric DBR mirror.

14. The VCSEL of claim 1, further comprising a template layer grown using a Lateral Epitaxial Overgrowth (LEO) technique.

15. The VCSEL of claim 1, wherein layers comprising the optical cavity and active region, and the cladding layers are grown from materials having any crystallographic orientation, including non-polar or semi-polar orientations.

16. The VCSEL of claim 1, further comprising a dielectric material deposited on the one or more cladding layers, in order to define an aperture having a dimension, and at least one additional metal layer deposited on and around the dielectric material of the aperture.

17. The VCSEL of claim 1, further comprising a phase matching layer deposited below the low-loss thin metal layers to account for phase introduced by the low-loss thin metal layers.

18. A method for independently controlling the optical mode and current distribution in a vertical-cavity surface-emitting laser (VCSEL) to optimize modal gain, comprising the steps of:
   (a) providing at least one curved mirror fabricated onto a substrate of the VCSEL; and
   (b) providing at least one electrical aperture formed by patterning one or more thin dielectric layers and then depositing one or more low-loss thin metal layers on and around the one or more thin dielectric layers,
   (c) wherein the low-loss thin metal layers simultaneously provide low resistance, non-rectifying, ohmic electrical contact, and enhanced lateral current spreading to the VCSEL.

19. A method of fabricating a vertical-cavity surface-emitting laser (VCSEL), comprising:
   (a) selecting a substrate;
   (b) depositing a template layer on the substrate;
   (c) depositing one or more first cladding layers on the substrate or template layer;
   (d) depositing an active region on top of the first cladding layers and at a position of maximum intensity of an optical standing wave pattern of the VCSEL;
   (e) depositing one or more second cladding layers on top of the active region;
   (f) selecting a micromirror radius of curvature to achieve a desired optical mode pattern inside a VCSEL cavity,
   (g) forming a micromirror with the radius of curvature in the substrate;
   (h) etching a mesa in the first cladding layers and active layer in order to define a volume that comprises a VCSEL pillar and at least one low-loss thin metal layer;
   (i) depositing an aperture layer on top of the cladding layers;
   (j) depositing at least one low-loss thin metal layer at or near a standing wave null of a VCSEL optical cavity mode to enhance current spreading and provide low resistance and non-rectifying ohmic contact to the VCSEL;
   (k) depositing one or more metal contact pads, comprising an n-contact, on top of the low-loss thin metal layer for providing electrical contact to the VCSEL;

(l) depositing a dielectric distributed Bragg reflector (DBR), metallic mirror, or combined metallic/dielectric DBR mirror on top of the low-loss thin metal to form a top reflector for a VCSEL cavity; and (m) depositing an epitaxial or dielectric DBR, metallic mirror, or combined metallic/dielectric DBR mirror on a surface of the micromirror to form a bottom reflector for the VCSEL cavity.

20. The method of claim 19, wherein the template layer is deposited using a Lateral Epitaxial Overgrowth (LEO) technique.

* * * * *